(12) United States Patent
Wu et al.

(10) Patent No.: US 6,281,047 B1
(45) Date of Patent: Aug. 28, 2001

(54) METHOD OF SINGULATING A BATCH OF INTEGRATED CIRCUIT PACKAGE UNITS CONSTRUCTED ON A SINGLE MATRIX BASE

(75) Inventors: Chi-Chuan Wu, Taichung; Chien-Ping Huang, Hsinchu Hsien, both of (TW)

(73) Assignee: Siliconware Precision Industries, Co., Ltd., Taipei (TW)

( * ) Notice: Subject to any disclaimer, the term of this patent is extended or adjusted under 35 U.S.C. 154(b) by 0 days.

(21) Appl. No.: 09/709,224

(22) Filed: Nov. 10, 2000

(51) Int. Cl.$^7$ .................................................. H01L 21/301
(52) U.S. Cl. ......................... 438/113; 438/462; 438/464
(58) Field of Search .................................. 438/113, 114, 438/462, 464, FOR 386, FOR 387; 148/DIG. 28

(56) References Cited

U.S. PATENT DOCUMENTS

| | | |
|---|---|---|
| 5,128,282 * | 7/1992 | Ormond et al. . |
| 5,157,001 * | 10/1992 | Sakuma . |
| 5,266,528 * | 11/1993 | Yamada . |
| 5,593,927 * | 1/1997 | Farnworth et al. . |
| 5,776,798 | 7/1998 | Quan et al. . |
| 5,786,266 * | 7/1998 | Boruta . |
| 5,989,982 * | 11/1999 | Yoshikazu . |
| 6,074,896 * | 6/2000 | Dando . |
| 6,117,347 * | 9/2000 | Ishida . |

* cited by examiner

Primary Examiner—George Fourson
Assistant Examiner—Joannie Adelle Garcia
(74) Attorney, Agent, or Firm—Peter F. Corless; Edwards & Angell, LLP (57) ABSTRACT

A package singulation method is proposed, which is useful for the singulation of a combined batch of small-scale integrated circuit package units, such as TFBGA (Thin & Fine Ball Grid Array) or QFN (Quad Flat Non-leaded) package units, that are constructed together on a single matrix base, without leaving remnant portions of provisional bars, such as electroplating bars or connect bars, in the singulated package units. The proposed package singulation method is characterized in the use of a two-step cutting procedure, where a large-width cutting blade is used in the first cutting step to cut into just the matrix base but not into the encapsulation body so that the provisional electroplating bar or connect bar can be entirely cut away; and in the second cutting step, a small-width cutting blade is used to cut all the way through the encapsulation body to singulate individual package units. The use of the large-width cutting blade in the first cutting step ensures easy alignment so that the provisional electroplating bar or connect bar would be absolutely cut away; and the use of the small-width cutting blade in the second cutting step allows only a small part of the encapsulation body over the matrix base to be cut away, so that the overall circuit layout area of each package site can remain the same.

9 Claims, 6 Drawing Sheets

METHOD OF SINGULATING A BATCH OF INTEGRATED CIRCUIT PACKAGE UNITS CONSTRUCTED ON A SINGLE MATRIX BASE

BACKGROUND OF THE INVENTION

1. Field of the Invention

This invention relates to integrated circuit packaging technology, and more particularly, to a method of singulating a combined batch of small-scale integrated circuit package units, such as TFBGA (Thin & Fine Ball Grid Array) or QFN (Quad Flat Non-leaded) package units, that are constructed on a single matrix base, without leaving remnant portions of provisional bars, such as electroplating bars or connect bars, in the singulated package units that would otherwise cause short-circuiting to the enclosed semiconductor chips.

2. Description of Related Art

Small-scale integrated circuit packages are typically fabricated in batch on a single base predefined with a matrix of package sites, each package site being used for the fabrication of one single package unit. After encapsulation is completed, it is required to performed a singulation process so as to singulate each individual package unit from the matrix base. TFBGA (Thin & Fine Ball Grid Array) and QFN (Quad Flat Non-leaded) packages, are typically fabricated in this way.

In the case of TFBGA, a substrate predefined with a matrix of package sites (hereinafter referred to as "matrix substrate") is used for the fabrication of a batch of TFBGA package units. The TFBGA matrix substrate is typically formed with a grid-like electroplating bar along the borderlines of the package sites, for the purpose of facilitating the required electroplating to the electrically-conductive traces on the TFBGA matrix substrate. The final singulation process is typically performed by cutting into the provisional electroplating bar, so that it can be incidentally cut away while singulating individual TFBGA package units.

In the case of QFN, a leadframe predefined with matrix of package sites (hereinafter referred to as "matrix leadframe") is used for the fabrication of a batch of QFN package units. The QFN matrix substrate is typically formed with a grid-like connect bar along the borderlines of the package sites, for the purpose of connecting the inner leads of the leadframe together before being singulated. The final singulation process is typically performed by cutting into the provisional connect bar, so that it can be incidentally cut away while singulating individual QFN package units.

One problem in the singulation of TFBGA and QFN package units, however, is that, if the cutting is misaligned, it would undesirably leave remnant portions of the provisional electroplating bars or connect bars in the singulated package units, thus resulting in short-circuiting between the electrically-conductive traces (in the case of TFBGA) or inner leads (in the case of QFN), which would make the enclosed semiconductor chips inoperable. As a result, the finished package units will be regarded as defective ones. This problem is illustrated depicted in the following with reference to FIGS. 1A–1E for TFBGA and FIGS. 2A–2E for QFN.

Conventional TFBGA Singulation (FIGS. 1A–1E)

Figure 1A:
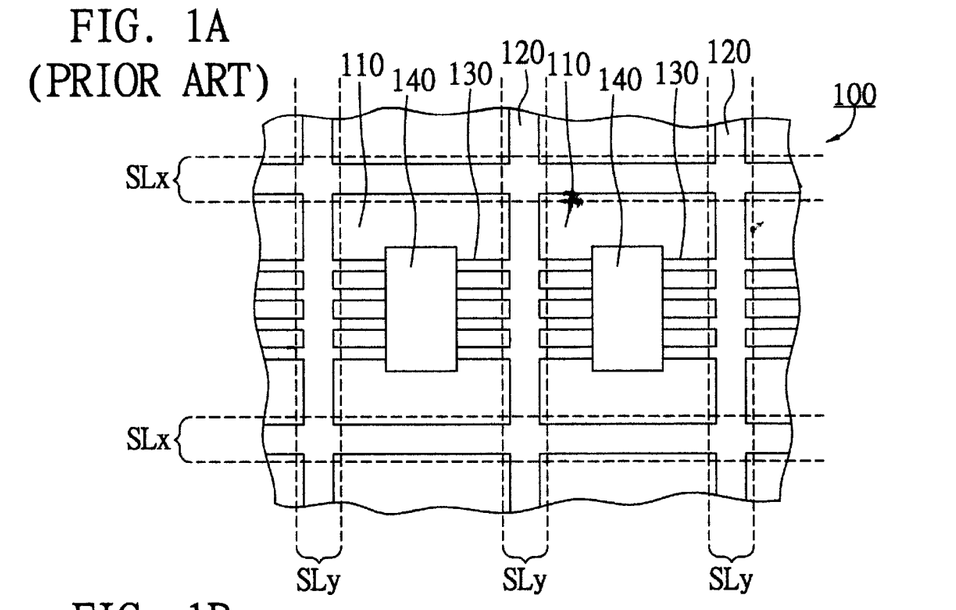
FIG. 1A (PRIOR ART) shows a schematic top view of part of a TFBGA matrix substrate used for TFBGA fabrication.
Figure 1B:
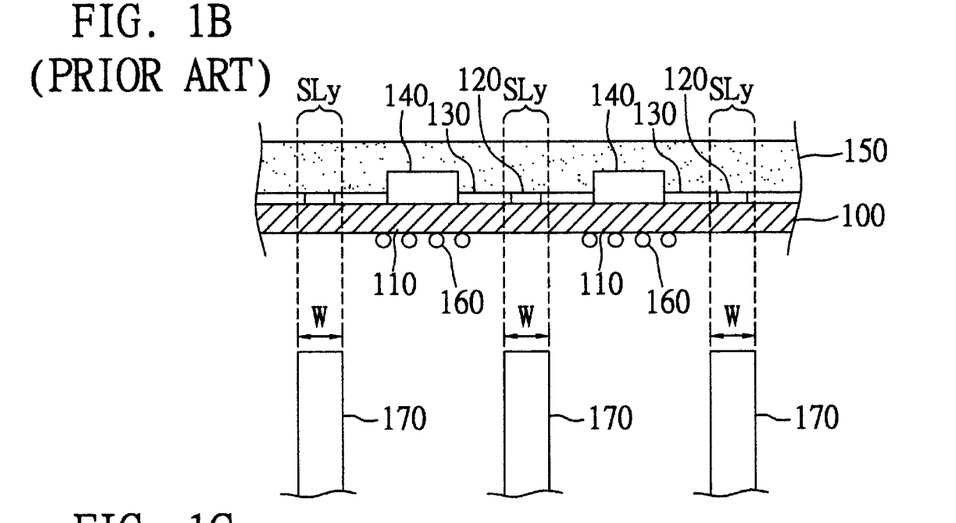
FIG. 1B (PRIOR ART) shows a schematic sectional view of an unsingulated batch of TFBGA package units constructed on the TFBGA matrix substrate of FIG. 1A.

FIG. 1A shows a schematic plan view of a TFBGA matrix substrate 100 used for TFBGA fabrication; and FIG. 1B shows a schematic sectional view of an unsingulated batch of TFBGA package units constructed on the TFBGA matrix substrate 100 (note that FIGS. 1A–1B are simplified to show only a small number of circuit components for demonstrative purpose; the actual circuit layout may be much more complex.)

As shown in FIG. 1A, the TFBGA matrix substrate 100 is predefined with a matrix of package sites 110 (only two are fully shown in FIG. 1A) used for the fabrication of a batch of TFBGA package units thereon. The package sites 110 are delimited from each other by a grid-like electroplating bar 120 which is formed along the borderlines of the package sites 110, and are each formed with a plurality of electrically-conductive traces 130 on the front side thereof. To facilitate electroplating process, these electrically-conductive traces 130 are all connected to the electroplating bar 120. Further, the package sites 110 are each mounted with at least one semiconductor chip 140 in the center of the front side thereof and electrically coupled to the electrically-conductive traces 130.

Further, as shown in FIG. 1B, a continuous encapsulation body 150 is molded to encapsulate all the semiconductor chips 140 over the TFBGA matrix substrate 100; and a plurality of solder balls 160 are implanted on the back side of the TFBGA matrix substrate 100. The electrically-conductive traces 130 on the front side of the TFBGA matrix substrate 100 are connected through electrically-conductive plugs (not shown) to the solder balls 160 on the back side of the same, for the purpose of electrically connecting the semiconductor chips 140 to the solder balls 160.

Before mounting the semiconductor chips 140, it is required to perform an electroplating process so as to electroplate an electrically-conductive material, such as nickel-gold (Ni-Au), onto the electrically-conductive traces 130. During the electroplating process, the electroplating electrical current is applied to the electroplating bar 120, so that the electrical current can be then concurrently distributed by the electroplating bar 120 to each of the electrically-conductive traces 130. After the electroplating process is completed, the electroplating bar 120 becomes a useless structure; and therefore, it can be subsequently cut away during the singulation process.

During the singulation process, a cutting blade 170 of a fixed width W greater than the width of the electroplating bar 120 is used to cut into the TFBGA matrix substrate 100 and the encapsulation body 150 along the crosswise singulation lines $SL_X$ and lengthwise singulation lines $SL_Y$ shown as dotted lines in FIGS. 1A–1B, for the purpose of singulating the combined batch of TFBGA package units constructed together on the TFBGA matrix substrate 100 into individual ones. The crosswise and lengthwise singulation lines $SL_X$, $SL_Y$ should be precisely aligned to cover the entire width of the electroplating bar 120 within the cutting range of the cutting blade 170.

Figure 1C:
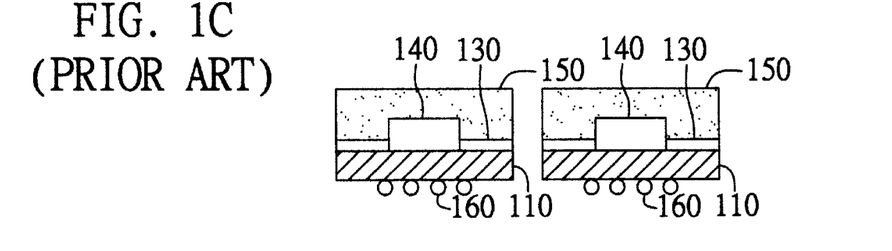
FIG. 1C (PRIOR ART) is a schematic sectional diagram of a singulated batch of TFBGA package units.

As further shown in FIG. 1C, the cutting by the cutting blade 170 is carried out all the way into the TFBGA matrix substrate 100 and the encapsulation body 150 along the crosswise and lengthwise singulation lines $SL_X$, $SL_Y$. Through this singulation process, the combined batch of TFBGA package units are singulated into individual ones.

One drawback to the forgoing TFBGA singulation, however, is that, since the TFBGA matrix substrate 100 is typically very small in size, where the electroplating bar 120 is typically from 0.05 mm to 0.1 mm (millimeter) in width, typically 0.07 mm, and the cutting blade 170 used in the singulation process is typically 0.3 mm in width, In this case, the cutting tolerance is only (0.3–0.07)2=0.115 mm. In other words, the cutting blade 170 should be highly precisely aligned to the electroplating bar 120 along the crosswise and lengthwise singulation lines $SL_X$, $SL_Y$ shown in FIGS.

1A–1B; otherwise, if the misalignment exceeds 0.115 mm, it would cause the problem of trace short-circuits.

Figure 1D:
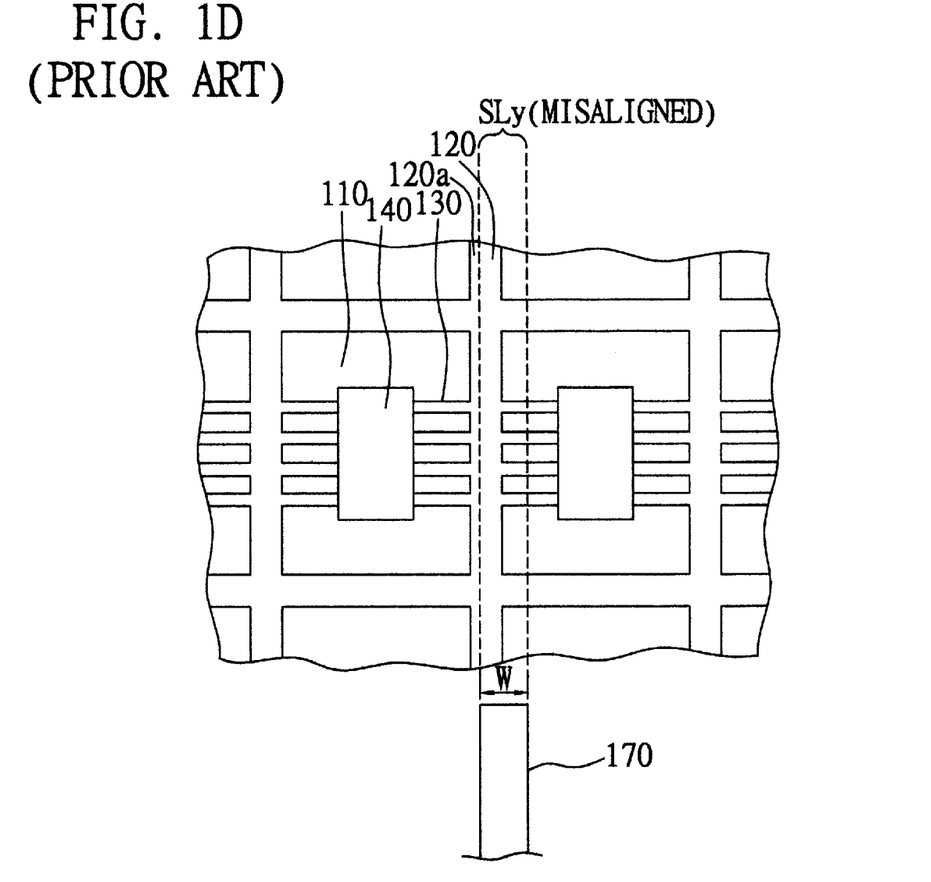
FIG. 1D (PRIOR ART) is a schematic diagram used to depict the drawback of a misaligned cutting during TFBGA singulation.

As shown in FIG. 1D, in the event that the cutting blade 170 is misaligned with respect to a lengthwise portion of the electroplating bar 120, then an edge part 1230a of the electroplating bar 120 will be uncovered by the lengthwise singulation lines $SL_Y$. As a result, the uncovered edge part 120a of the electroplating bar 120 is beyond the cutting range of the cutting blade 170.

Figure 1E:
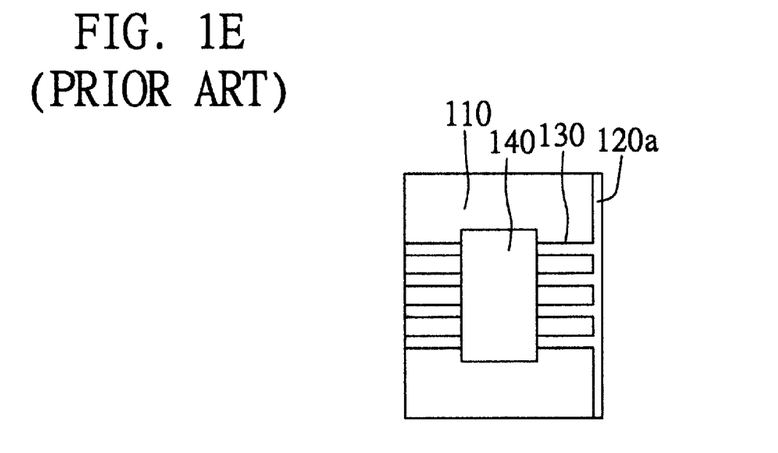
FIG. 1E (PRIOR ART) is a schematic diagram of a singulated TFBGA package unit having a remnant portion of electroplating bar causing short-circuiting to the enclosed semiconductor chip.

As further shown in FIG. 1E, the case of FIG. 1D would cause the uncovered edge part 120a of the original electroplating bar 120 to remain over the edge of the singulated package site 110, thus undesirably causing the electrically-conductive traces 130 to be short-circuited to each other. As a result, this singulated TFBGA package unit would be regarded as defective.

One solution to the foregoing problem is to use a cutting blade of a greater width to perform the singulation process. This solution, however, is quite unfeasible since it will cut away a larger part of the TFBGA matrix substrate 100 and the encapsulation body 150, thus reducing the already very small circuit layout area of each package site.

Another solution is to repeatedly check the result of each pass of cutting; and if the electroplating bar 120 is not entirely cutaway, the cutting blade 170 is realigned to perform another pass of cutting until the electroplating bar 120 is entirely cut away. This solution, however, is quite laborious and time-consuming.

Conventional QFN Singulation (FIGS. 2A–2E)

Figure 2A:
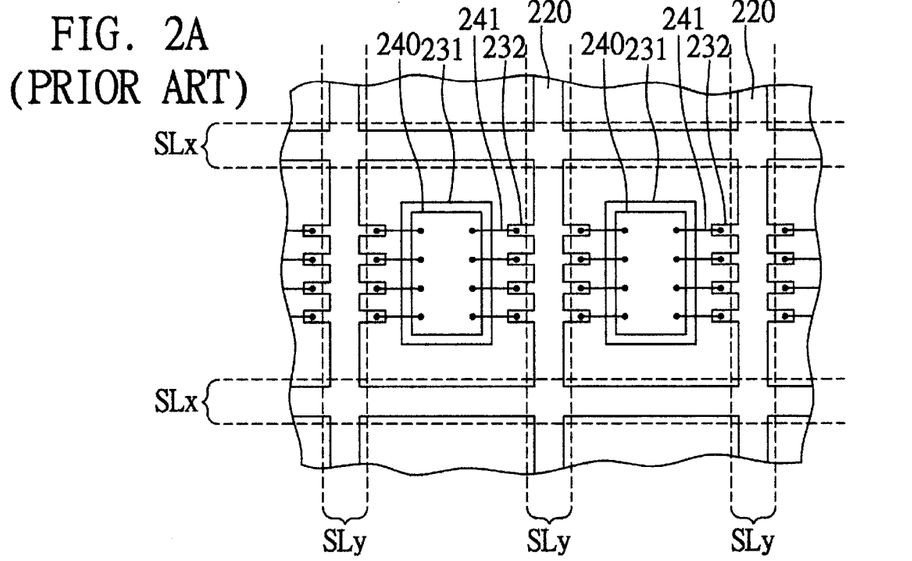
FIG. 2A (PRIOR ART) shows a schematic top view of part of a QFN matrix leadframe used for QFN fabrication.
Figure 2B:
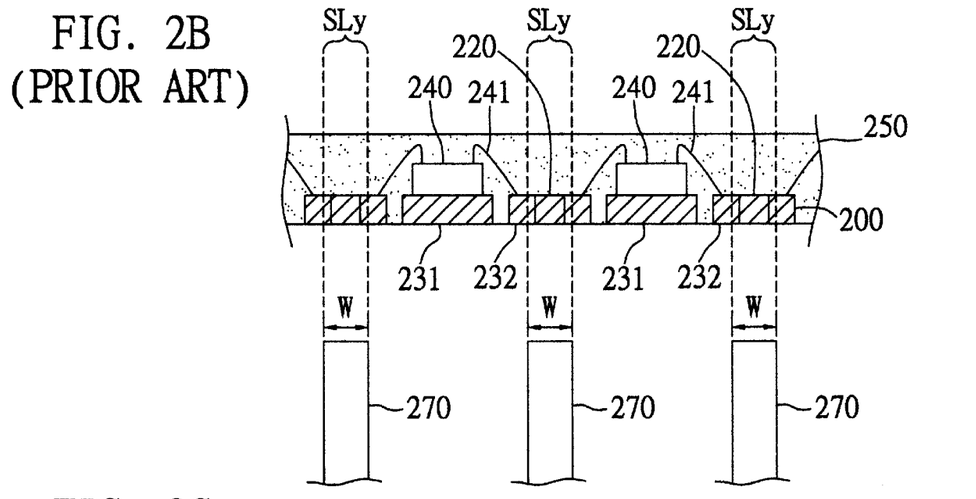
FIG. 2B (PRIOR ART) shows a schematic sectional view of an unsingulated batch of QFN package units constructed on the QFN matrix leadframe of FIG. 2A.

FIG. 2A shows a schematic plan view of a QFN matrix leadframe 200 used for QFN fabrication; and FIG. 2B shows a schematic sectional view of an unsingulated batch of TFBGA package units constructed on the QFN matrix leadframe 200 (note that FIGS. 2A–2B are simplified to show only a small number of circuit components for demonstrative purpose; the actual circuit layout may be much more complex.)

As shown in FIG. 2A the QFN matrix leadframe 200 is predefined with a matrix of package sites 210 (only two are fully shown in FIG. 2A) used for the fabrication of a batch of QFN package units thereon. These package sites 210 are delimited from each other by a grid-like connect bar 220 which is formed along the borderlines of the package sites 210, and each include a die pad 231 and a plurality of inner leads 232 which are all connected to the grid-like connect bar 220 so that these inner leads 232 can be held together before being singulated. Further, the package sites 210 are each mounted with at least one semiconductor chip 240 on the die pad 231 thereof and electrically connected by means of a set of bonding wires 241 to the inner leads 232.

As further shown in FIG. 2B, a continuous encapsulation body 250 is molded to encapsulate all the semiconductor chips 240 over the QFN matrix leadframe 200. During subsequent singulation process, a cutting blade 270 of a fixed width W greater than the width of the connect bar 220 is used to cut into the QFN matrix leadframe 200 and the encapsulation body 250 along the crosswise singulation lines $SL_X$ and lengthwise singulation lines $SL_Y$ shown as dotted lines in FIGS. 2A–2B, for the purpose of singulating the combined batch of QFN package units constructed together on the QFN matrix leadframe 200 into individual ones. The crosswise and lengthwise singulation lines $SL_X$, $SL_Y$ should be precisely aligned to cover the entire width of the grid-like connect bar 220 within the cutting range of the cutting blade 270.

Figure 2C:
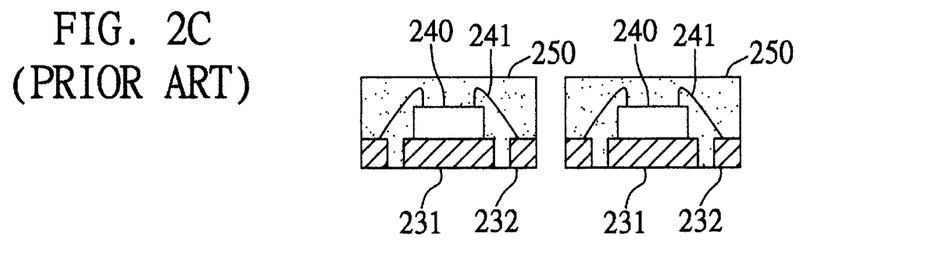
FIG. 2C (PRIOR ART) is a schematic sectional diagram of a singulated batch of QFN package units.

As further shown in FIG. 2C, the cutting by the cutting blade 270 is carried out all the way into the QFN matrix leadframe 200 and the encapsulation body 250 along the crosswise and lengthwise singulation lines $SL_X$, $SL_Y$. Through this singulation process, the combined batch of QFN package units are singulated into individual ones.

Figure 2D:
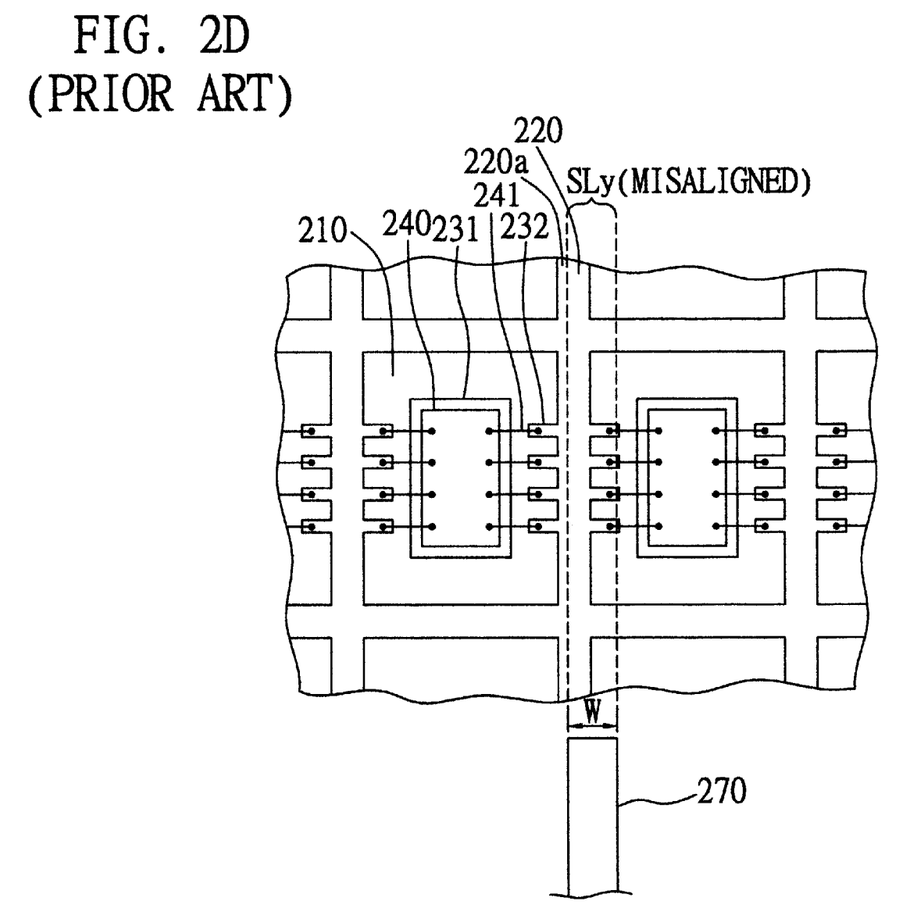
FIG. 2D (PRIOR ART) is a schematic diagram used to depict the drawback of a misaligned cutting during QFN singulation.

As shown in FIG. 2D, in the event that the cutting blade 270 is misaligned to a lengthwise portion of the grid-like connect bar 220, then an edge part 220a of the connect bar 220 will be uncovered by the lengthwise singulation lines $SL_Y$. As a result, the uncovered edge part 220a of the grid-like connect bar 220 is beyond the cutting range of the cutting blade 270.

Figure 2E:
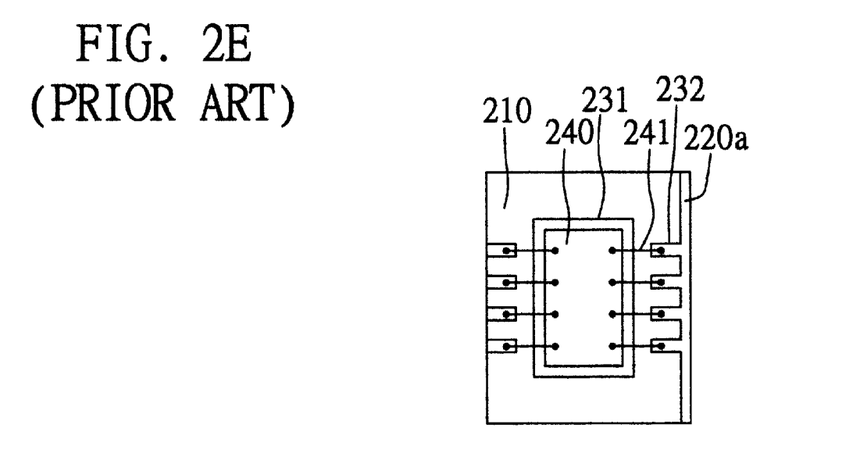
FIG. 2E (PRIOR ART) is a schematic diagram of a singulated QFN package unit having a remnant portion of connect bar causing short-circuiting to the enclosed semiconductor chip.

As further shown in FIG. 2E, the case of FIG. 2D would cause the uncovered edge part 220a of the original grid-like connect bar 220 to remain over the edge of the singulated package site 210, thus undesirably causing the inner leads 232 to be short-circuited to each other. As a result, this singulated QFN package unit would be regarded as defective.

One solution to the foregoing problem is to use a cutting blade of a greater width to perform the singulation process. This solution, however, is quite unfeasible since it will cut away a larger part of the QFN matrix leadframe 200 and the encapsulation body 250, thus reducing the already very small circuit layout area of each package site.

Another solution is to repeatedly check the result of each pass of cutting; and if the connect bar 220 is not entirely cutaway, the cutting blade 270 is realigned to perform another pass of cutting until the connect bar 220 is entirely cut away. This solution, however, is quite laborious and time-consuming.

SUMMARY OF THE INVENTION

It is therefore an objective of this invention to provide a new package singulation method, which can be utilized to singulate a combined batch of package units constructed on a single matrix base without leaving any remnant portions of provisions bars in the singulated package units.

It is another objective of this invention to provide a new package singulation method, which can cut away the entire electroplating bar or connect bar without having to reduce the layout area of each package site.

It is another objective of this invention to provide a new package singulation method, which can be carried out without having to repeatedly check the result of each pass of cutting, so that the singulation process can be completed more quickly.

In accordance with the foregoing and other objectives, the invention proposes a new package singulation method for singulating a combined batch of small-scale integrated circuit package units constructed on a single matrix base into individual ones.

The method of the invention is utilized for singulating a combined batch of integrated circuit package units constructed on a single matrix base and enclosed in a continuous encapsulation body; the matrix base being defined with a matrix of package sites delimited by a provisional bar structure of a certain width defining a singulation line for the singulation of the integrated circuit package units.

The package singulation method of the invention comprises the following procedural steps: (1) performing a first cutting step, wherein a first cutting blade of a first width greater than the width of the provisional bar is used to be cut into the matrix base along the singulation line defined by the provisional bar, but not into the encapsulation body, until the provisional bar is substantially entirely cut away; and (2) performing a second cutting step, wherein a second cutting blade of second width smaller than the first width is used to cut into the encapsulation body along the borderlines between the package sites so as to singulate the combined batch of integrated circuit package unit into individual ones.

The use of the large-width cutting blade in the first cutting step ensures that the provisional electroplating bar or connect bar would be absolutely cut away in one pass of cutting; and the use of the small-width cutting blade in the second cutting step allows only a small part of the encapsulation body over the matrix base to be cut away, so that the overall circuit layout area of each package site can remain the same. The invention is therefore more advantageous to use than the prior art.

BRIEF DESCRIPTION OF DRAWINGS

This invention can be more fully understood by reading the following detailed description of the preferred embodiments, with reference made to the accompanying drawings, wherein.

DETAILED DESCRIPTION OF PREFERRED EMBODIMENTS

The package singulation method according to the invention is disclosed in full details by way of two preferred embodiments in the following with reference to FIGS. 3A–3C and FIGS. 4A–4C respectively. In the first preferred embodiment of FIGS. 3A–3C, the invention is utilized for TFBGA singulation; whereas in the second preferred embodiment of FIGS. 4A–4C, the invention is utilized for QFN singulation.

Broadly speaking, the package singulation method of the invention is applicable for the singulation of a combined batch of integrated circuit package units constructed on a single matrix base defined with a plurality of package sites delimited by a provisional bar structure that is to cut away during the final singulation process, for the purpose of cutting away the entire bar structure without leaving any remnant portions of the bar structure in the singulated package units.

It is to be noted that the package singulation method of the invention can be applied only to the lengthwise portions of the grid-like electroplating bar or connect bar since the crosswise portions thereof are unconnected to electrically-conductive traces or inner leads. Therefore, in the following preferred embodiments, the cutting into the crosswise singulation lines $SL_X$ will not be described.

Figure 3A:
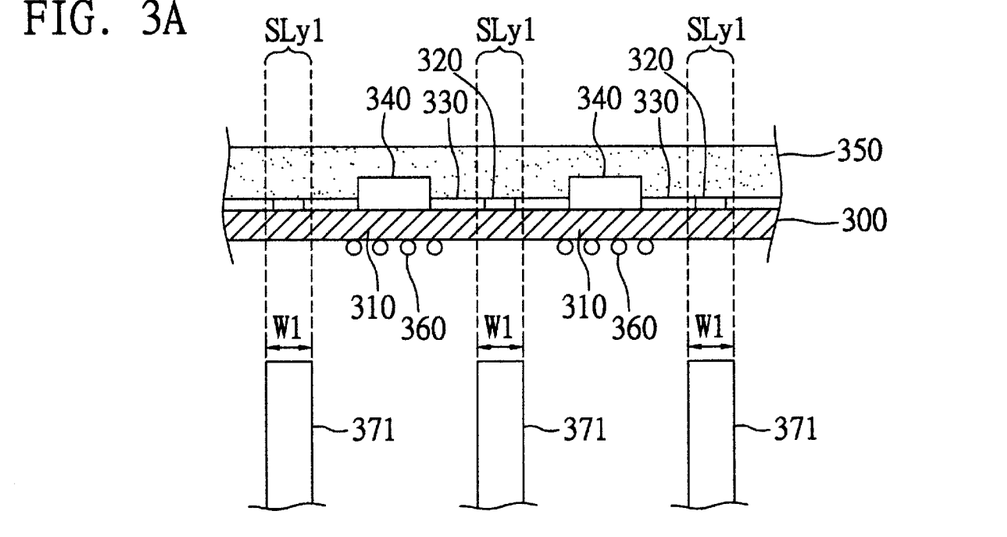
FIGS. 3A–3C are schematic sectional diagrams used to depict a first embodiment of the package singulation method of the invention when utilized for TFBGA singulation.
Figure 3B:
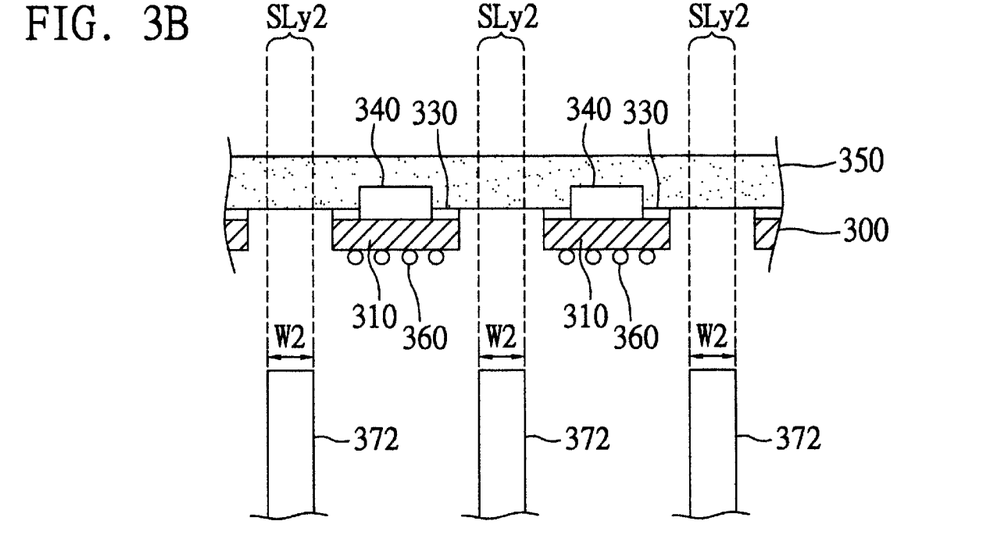
Figure 3C:
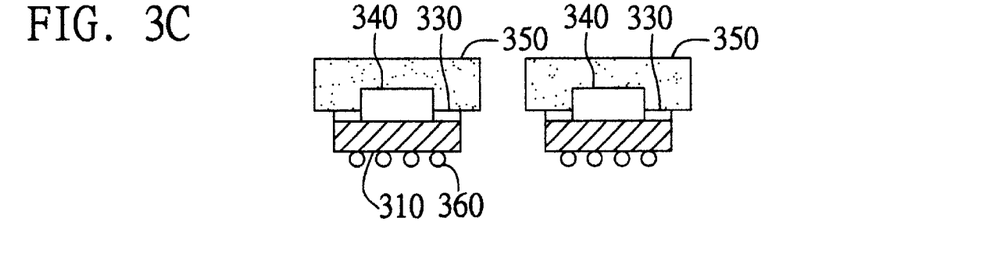

FIRST PREFERRED EMBODIMENT (FIGS. 3A–3C)

The first preferred embodiment of the package singulation method of the invention is disclosed in full details in the following with reference to FIGS. 3A–3C. In this preferred embodiment, the invention is specifically utilized for the singulation of a batch of TFBGA package units constructed on a single TFBGA matrix substrate.

Referring to FIG. 3A, the invention is here utilized on an already encapsulated but still unsingulated batch of TFBGA package units constructed on a single TFBGA matrix substrate 300 which is predefined with a plurality of package sites 310 delimited from each other by a grid-like electroplating bar 320 formed along the borderlines of the package sites 310. The package sites 310 are each formed with a plurality of electrically-conductive traces 330 and is further mounted with a semiconductor chip 340 which is electrically coupled to the electrically-conductive traces 330. During encapsulation process, a continuous encapsulation body 350 is molded to encapsulate all the semiconductor chips 340 over the TFBGA matrix substrate 300; and a plurality of solder balls 360 are implanted on the back side of the TFBGA matrix substrate 300.

It is a characteristic feature of the invention that the singulation of the combined batch of TFBGA package units over the TFBGA matrix substrate 300 is performed in two cutting steps.

The first cutting step is to use a first cutting blade 371 of a width $W_1$ to cut into just the TFBGA matrix substrate 300 but not into the encapsulation body 350 along the lengthwise singulation lines $SL_{Y1}$ aligned to electroplating bar 320, where the width $W_1$ should be as greater than the width of the electroplating bar 320 as possible, but shouldn't be overly wise as to cut into the solder balls 360. It is to be noted that the cutting by the first cutting blade 371 into the TFBGA matrix substrate 300 should be precisely controlled to the depth that just cut away the electroplating bar 320, but not further into the encapsulation body 350.

Referring further to FIG. 3B, in the next cutting step, a second cutting blade 372 of width $W_2$, which is smaller than $W_1$, is used to cut all the way into the encapsulation body 350 along the lengthwise singulation lines $SL_{Y2}$ defined by the borderlines between the package sites 310 so as to cut apart the encapsulation body 350 into separate units.

Referring further to FIG. 3C, the cutting by the second cutting blade 372 is carried out all the way into and through the encapsulation body 350, whereby the previously combined batch of TFBGA package units are singulated into individual ones.

Figure 4A:
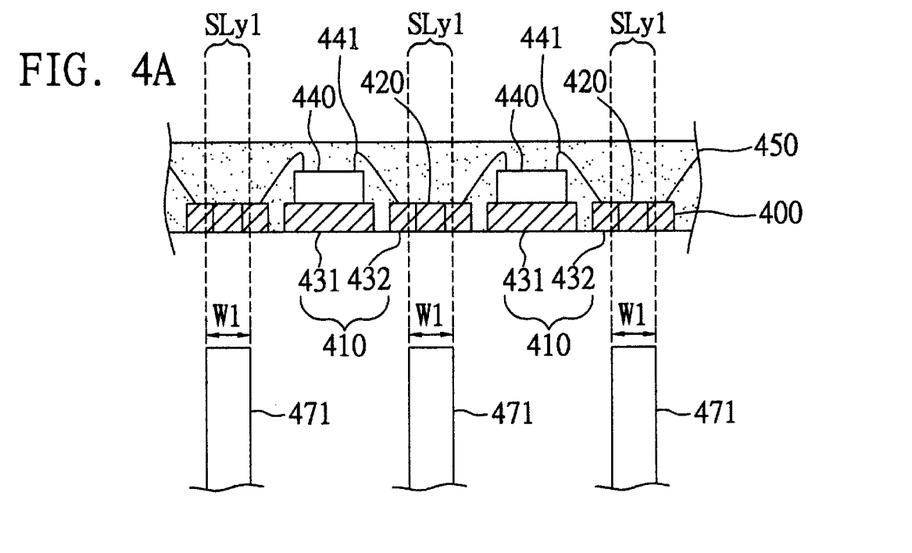
FIGS. 4A–4C are schematic sectional diagrams used to depict a second embodiment of the package singulation method of the invention when utilized for QFN singulation.
Figure 4B:
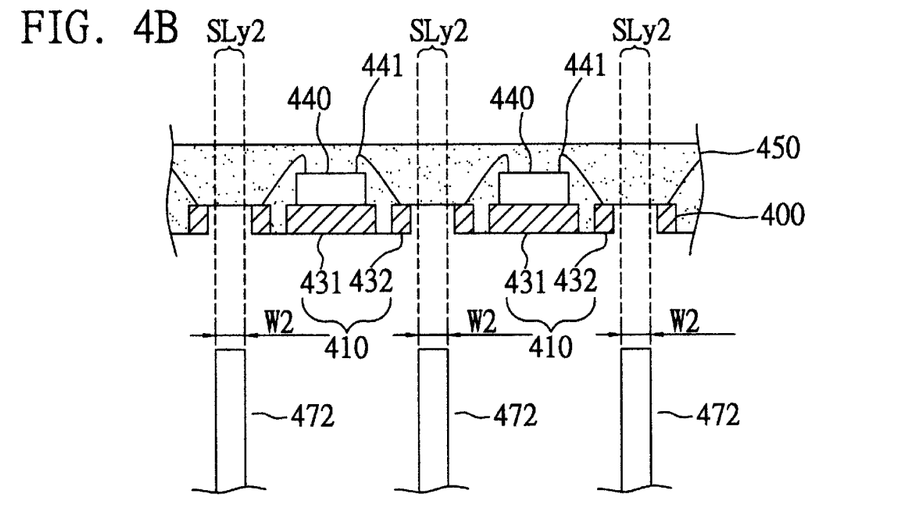
Figure 4C:
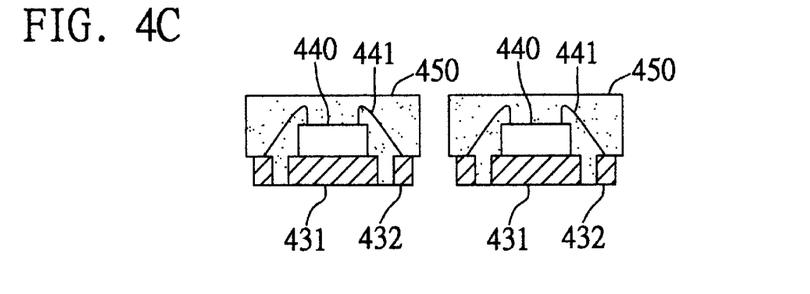

SECOND PREFERRED EMBODIMENT (FIGS. 4A–4C)

The second preferred embodiment of the package singulation method of the invention is disclosed in full details in the following with reference to FIGS. 4A–4C. In this preferred embodiment, the invention is specifically utilized for the singulation of a combined batch of QFN package units constructed on a single matrix leadframe.

Referring to FIG. 4A, the invention is here utilized on an already encapsulated but still unsingulated batch of QFN units constructed on a single QFN matrix leadframe 400 which is predefined with a matrix of package sites 410 for the fabrication of a batch of QFN package units thereon. These package sites 410 are delimited from each other by a grid-like connect bar 420 formed along the borderlines of the package sites 410. The package sites 410 each include a die pad 431 and a plurality of inner leads 432 which are all connected to the connect bar 420. Further, the package sites 410 are each mounted with at least one semiconductor chip 440 on the die pad 431 thereof and electrically coupled by means of a set of bonding wires 441 to the inner leads 432. During encapsulation process, a continuous encapsulation body 450 is molded to encapsulate all the semiconductor chips 440 over the QFN matrix leadframe 400.

It is a characteristic feature of the invention that the singulation of the combined batch of QFN package units over the QFN matrix leadframe 400 is performed in two cutting steps.

The first cutting step is to use a first cutting blade 471 of a width $W_1$ to cut into just the QFN matrix leadframe 400 but not into the encapsulation body 450 along the lengthwise singulation lines $SL_{Y1}$ aligned to the connect bar 420, where the width $W_1$ should be as greater than the width of the connect bar 420 as possible, but shouldn't be overly wide as to cut into the bonding wires 441. It is to be noted that the cutting by the first cutting blade 471 into the QFN matrix leadframe 400 should be precisely controlled to the depth that just cut away the connect bar 420, but not into the encapsulation body 450.

Referring further to FIG. 4B, in the next cutting step, a second cutting blade 472 of width $W_2$, where $W_2 < W_1$, is used to cut all the way into and through the encapsulation body 450 along the lengthwise singulation lines $SL_{Y2}$ defined by the borderlines between the package sites 410 so as to cut apart the encapsulation body 450 into separate units.

Referring further to FIG. 4C, the cutting by the second cutting blade 472 is carried out all the way into and through the encapsulation body 450, whereby the previously combined batch of QFN package units are singulated into individual ones.

CONCLUSION

In conclusion, the invention provides a new method for singulating a combined batch of small-scale integrated circuit package units, which as TFBGA or QFN package units, that are constructed on a single matrix base, such as a TFBGA matrix substrate or a QFN matrix leadframe, into individual package units. The method of the invention is characterized in the use of a two-step cutting procedure, wherein a large-width cutting blade is used in the first cutting step to cut into just the matrix base but not into the encapsulation body so that the provisional electroplating bar or connect bar can be absolutely cut away; and then, a small-width cutting blade is used in the second cutting step to cut all the way through the encapsulation body to singulate individual package units. The use of the large-width cutting blade in the first cutting step ensures that the provisional electroplating bar or connect bar would be absolutely cut away in one pass of cutting; and the use of the small-width cutting blade in the second cutting step allows only a small part of the encapsulation body over the matrix base to be cut away, so that the overall circuit layout area of each package site can remain the same. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for singulating a combined batch of integrated circuit package units constructed on a single matrix base and enclosed in a continuous encapsulation body; the matrix base being defined with a matrix of package sites delimited by a provisional bar structure of a certain width defining a singulation line for the singulation of the integrated circuit package units;

the method comprising the steps of:
   (1) performing a first cutting step, wherein a first cutting blade of a first width greater than the width of the provisional bar is used to cut into the matrix base along the singulation line defined by the provisional bar, but not into the encapsulation body, until the provisional bar is substantially entirely cut away; and
   (2) performing a second cutting step, wherein a second cutting blade of a second width smaller than the first width is used to cut into the encapsulation body along the borderlines between the package sites so as to singulate the combined batch of integrated circuit package unit into individual ones.

2. The method of claim 1, wherein the integrated circuit package units are TFBGA package units.

3. The method of claim 2, wherein the matrix base is a TFBGA matrix substrate.

4. The method of claim 3, wherein the provisional bar is gold pattern electroplated bar.

5. The method of claim 1, wherein the integrated circuit package units are QFN package units.

6. The method of claim 5, wherein the matrix base is a QFN matrix leadframe including a die pad and a plurality of inner leads.

7. The method of claim 6, wherein the provisional bar is a grid pattern connect bar for connecting the inner leads together before being singulated.

8. A method for singulating a combined batch of TFBGA package units constructed on a single TFBGA matrix substrate and enclosed in a continuous encapsulation body; the TFBGA matrix substrate being defined with a matrix of package sites delimited by a provisional bar of a certain width defining a singulation line for the singulation of the TFBGA package units;

the method comprising the steps of:
   (1) performing a first cutting step, wherein a first cutting blade of a first width greater than the width of the provisional bar is used to cut into the TFBGA matrix substrate along the singulation line defined by the provisional bar, but not into the encapsulation body, until the provisional bar is substantially entirely cut away; and (2) performing a second cutting step, wherein a second cutting blade of a second width smaller than the first width is used to cut into the encapsulation body along the borderlines between the package sites so as to singulate the combined batch of TFBGA package unit into individual ones.

9. A method for singulating a combined batch of QFN package units constructed on a single QFN matrix leadframe and enclosed in a continuous encapsulation body; the QFN matrix leadframe being defined with a matrix of package sites delimited by a provisional bar of a certain width defining a singulation line for the singulation of the QFN package units; the method comprising the steps of:

(1) performing a first cutting step, wherein a first cutting blade of a first width greater than the width of the provisional bar is used to cut into the QFN matrix leadframe along the singulation line defined by the provisional bar, but not into the encapsulation body, until the provisional bar is substantially entirely cut away; and (2) performing a second cutting step, wherein a second cutting blade of a second width smaller than the first width is used to cut into the encapsulation body along the borderlines between the package sites so as to singulate the combined batch of QFN package unit into individual ones.

* * * * *